(12) United States Patent
Kawashimo et al.

(10) Patent No.: US 7,319,575 B2
(45) Date of Patent: Jan. 15, 2008

(54) SEMICONDUCTOR DEVICE

(75) Inventors: Tatsuya Kawashimo, Kokubunji (JP);
Hiroki Yamashita, Hachioji (JP);
Masayoshi Yagyu, Hanno (JP)

(73) Assignee: Hitachi, Ltd., Tokyo (JP)

( * ) Notice: Subject to any disclaimer, the term of this patent is extended or adjusted under 35 U.S.C. 154(b) by 239 days.

(21) Appl. No.: 11/288,323

(22) Filed: Nov. 29, 2005

(65) Prior Publication Data
US 2006/0158802 A1 Jul. 20, 2006

(30) Foreign Application Priority Data
Jan. 20, 2005 (JP) .............................. 2005-013045

(51) Int. Cl.
*H02H 9/00* (2006.01)
*H03K 17/16* (2006.01)
(52) U.S. Cl. .......................................... 361/56; 326/30
(58) Field of Classification Search ................. 361/56, 361/111; 326/30
See application file for complete search history.

(56) References Cited

U.S. PATENT DOCUMENTS 5,615,073 A * 3/1997 Fried et al. .................. 361/56
6,181,157 B1 * 1/2001 Fiedler ........................ 326/30
6,353,334 B1 * 3/2002 Schultz et al. ................ 326/82
6,424,169 B1 * 7/2002 Partow et al. ................ 326/30
2002/0014904 A1 2/2002 Morishita

FOREIGN PATENT DOCUMENTS

JP 2002-050698 8/2000

\* cited by examiner

*Primary Examiner*—Michael Sherry
*Assistant Examiner*—Boris Benenson
(74) *Attorney, Agent, or Firm*—Reed Smith LLP; Stanley P. Fisher, Esq.; Juan Carlos A. Marquez, Esq.

(57) ABSTRACT

This invention provides a semiconductor device in which an ESD protection circuit and a termination circuit can be realized with a small die area. A PMOS transistor having an ESD protection function is placed between a signal node on a line from an signal terminal to an input buffer and a supply voltage node. Furthermore, a voltage generator circuit is placed to supply a reference voltage to the gate of the PMOS transistor. By the reference voltage controlled by the voltage generator circuit, a source drain resistance of the PMOS transistor is set. Thereby, the PMOS transistor can be made to function as a terminating resistor whose resistance can be set adaptively to a characteristic impedance of a transmission line, for example, connected to the signal terminal in addition to the ESD protection function.

16 Claims, 9 Drawing Sheets

SEMICONDUCTOR DEVICE

CLAIM OF PRIORITY

The present application claims priority from Japanese application JP 2005-013045 filed on Jan. 20, 2005, the content of which is hereby incorporated by reference into this application.

FIELD OF THE INVENTION

The present invention relates to a semiconductor device and more particularly to a technique that is effectively applied to a semiconductor device for high-speed transmission, equipped with an electrostatic discharge (ESD) protection circuit and a signal termination circuit.

BACKGROUND OF THE INVENTION

A typical implementation of ESD protection circuit technology is considered below. According to such a circuit, for example, an ESD protection circuit can suppress increases in additional capacitance of a signal terminal is disclosed in JP-A No. 2002-50698. In this circuit construction, a resistor element and a diode-connected (gate-source shorted) PMOS transistor 1 are placed between a signal terminal and a power supply line, a resistor element and a diode-connected NMOS transistor 2 are placed between the signal terminal and a ground (GND) line, and a diode connected NMOS transistor 3 is placed between the power supply line and the GND line. When an instantaneous high voltage is applied to the signal terminal, power consumed by the PMOS transistor 1 and the NMOS transistor 2 can be reduced by the resistor elements and the NMOS transistor 3. Consequently, the circuit can be made smaller and increases in additional capacitance of the signal terminal can be suppressed.

In a semiconductor chip, usually, an ESD protection circuit like the one disclosed in JP-A No. 2002-50698 is provided near an external signal terminal to prevent internal device destruction due to the application of an instantaneous high voltage or the like (hereinafter referred to as a surge) to the external signal terminal. Models of device destruction by this surge, a human body model, machine model, device charging model, etc. are widely known.

Meanwhile, for latest integrated circuit (IC) technologies that boost IC speed and reduce the component mounting area on a wiring board for product downsizing, a termination circuit may be provided in a semiconductor chip. Particularly, in a semiconductor chip having a data transfer speed of several hundred megabits per second to several gigabits per second, reflection waveforms occurring when data is transmitted through the chip become serious. For this reason, a termination circuit for impedance matching may be provided in the vicinity of an external signal terminal or between modules if a semiconductor chip consists of multiple modules.

Here, using an input circuit portion of such a semiconductor chip as an example, an example of its configuration is discussed. Referring to FIG. 13, which is a circuit diagram showing an example of the configuration of the input circuit portion of a semiconductor device. The semiconductor device shown in FIG. 13 is provided with an ESD protection circuit and a termination circuit on a signal node 1 on the line from a signal terminal IN to an input buffer Buf.

The ESD protection circuit is made up of, for example, a resistor element R7 and a diode D1 connected in series, placed between a supply voltage node VDD and the signal node ND1, and a diode D2 and a resistor element R8 connected in series, placed between the signal node ND1 and a reference voltage node VSS. The termination circuit is realized by, for example, a terminating resistor element Rt placed between the supply voltage node VDD and the signal node ND1. The diodes D1 and D2 may be replaced by diode-connected MOS transistors or other similar elements known to those possessing an ordinary skill in the pertinent arts, as is the case for the ESD protection circuit disclosed in JP-A No. 2002-50698.

However, when such a semiconductor chip comes to have an increasing number of signal terminals IN, die area increase will become a problem, because it is necessary to provide an ESD protection circuit and a termination circuit for each terminal. For example, if the termination circuit is provided by a resistor element, a relatively large die area is needed to form the resistor element on the semiconductor substrate. In recent years, there is an increasing need for higher-speed and smaller mobile devices and decreasing the die area is a crucial challenge.

Therefore a need exists to provide a semiconductor device in which an ESD protection circuit and a termination circuit can be realized with a smaller die area.

SUMMARY OF THE INVENTION

A semiconductor device of the present invention comprises a signal terminal, a signal wiring line connected to the signal terminal, a power supply wiring line, an input buffer connected to the signal wiring line, a first transistor which clamps a voltage between the signal wiring line and the power supply wiring line by source-drain conduction to provide ESD protection, and a voltage generator circuit which controls a gate voltage of the first transistor. A feature of this semiconductor device resides in that a source-drain resistance of the first transistor is set by the voltage generator circuit, whereby the first transistor is provided with a function of signal termination in addition to a function of ESD protection.

This feature eliminates the need to create an ESD protection element and a terminating resistor element separately when forming a semiconductor chip including terminating resistors. The roles of these elements can be fulfilled by a single transistor and, therefore, decreasing the die area becomes possible.

The first transistor may be placed, for example, between a high potential power supply wiring line (such as VDD) and the signal wiring line, may be placed between a low potential power supply wiring line (such as VSS) and the signal wiring line, or two transistors may be placed on both sides. If the first transistor is placed on either the VDD side or the VSS side, it functions as so-called parallel termination. If two transistors are placed on both the VDD and VSS sides, they function as so-called Thevenin termination. It is preferable to employ a P-channel MOS transistor as the first transistor to be placed on the VDD side and an N-channel MOS transistor as the first transistor to be placed on the VSS side.

The voltage generator circuit can be realized by, for example, a resistor element connected between a gate of the first transistor and the power supply wiring line and a current source for setting a current to flow through this resistor element. For instance, the current source may be a variable current source. A gate-source voltage of the first transistor, which is a potential across the resistor element, can be set freely by the variable current source and, consequently, the source-drain resistance of the first transistor will be variable.

Thereby, it becomes possible to set a desired terminating resistance adaptively to the characteristics of a transmission line, for example.

The voltage generator circuit can also be realized by, for example, an amplifier circuit having a first input node, a second input node, and an output node, a reference resistor connected between the power supply wiring line and the first input node, a first current source for allowing a first current to flow through the reference resistor, a referential transistor, having a source and a drain connected between the power supply wiring line and the second input node and a gate connected to the output node, and a second current source for allowing a second current to flow through the referential transistor. The output node is connected to the gate of the first transistor. The size of the referential transistor should be $1/n$ ($n \geq 1$) of the size of the first transistor and the second current should be $1/n$ of the first current.

When this voltage generator circuit, for example, is used, it becomes possible to fix the terminating resistance of the first transistor by the resistance of the reference resistor. If the reference resistor is a variable resistor, it becomes possible to set a desired terminating resistance adaptively to the characteristics of a transmission line, for example, as explained above. Moreover, because the size of the referential transistor can be reduced to $1/n$ of the size of the first transistor, the die area occupied by the voltage generator circuit can be reduced.

If a semiconductor chip has a plurality of signal terminals, it is needed to provide first transistors as described above individually for each signal terminal. However, for example, the gate voltages of these transistors can be controlled in common by using a single voltage generator circuit. Thus, an effect of decreasing the die area by providing an individual first transistor with the ESD protection function and the termination function becomes significant particularly when the chip has a larger number of signal terminals. In this case, there is a possibility that noise is generated due to long wiring length from the output node of the voltage generator circuit to the gates of the first transistors. Thus, a bypass capacitor may be inserted between the gate of each first transistor and the power supply wiring line.

An effect that is obtained by typical aspects of the invention disclosed in this application will be summarized below. By provision of a means for controlling the gate voltage of an ESD protective transistor which clamps a voltage between the signal wiring line and power supply wiring line, the ESD protective transistor can be made to function as a terminating resistor as well and the ESD protection circuit and termination circuit can be realized with a small die area.

BRIEF DESCRIPTION OF THE DRAWINGS

Understanding of the present invention will be facilitated by consideration of the following detailed description of the preferred embodiments of the present invention taken in conjunction with the accompanying drawings, in which like numerals refer to like parts.

DETAILED DESCRIPTION

Figure 1:
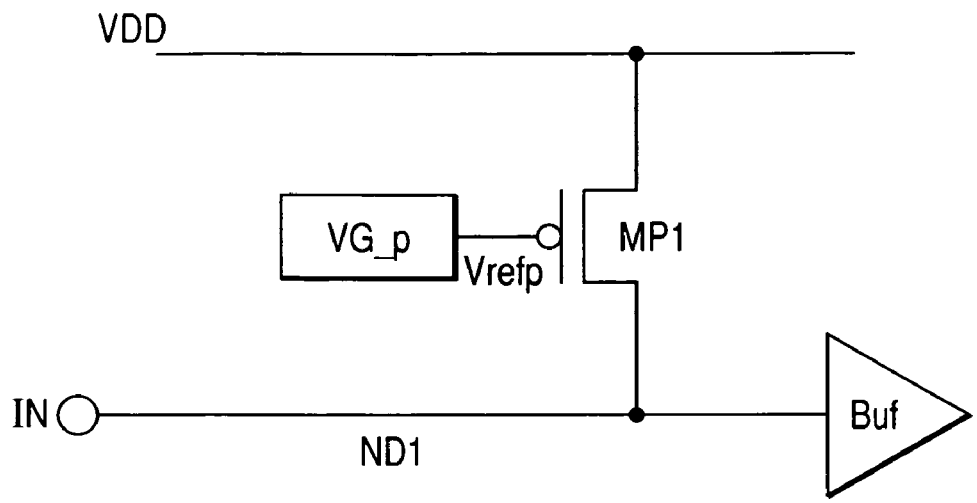
FIG. 1 is a circuit diagram showing an example of a configuration of a semiconductor device according to an aspect of the present invention.

It is to be understood that the figures and descriptions of the present invention have been simplified to illustrate elements that are relevant for a clear understanding of the present invention, while eliminating, for the purpose of clarity, many other elements found in typical semiconductor devices and methods of making the same. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Circuit elements constituting each of the functional blocks hereinbelow may be formed on a monocrystalline silicon semiconductor substrate or the like by CMOS (Complementary MOS) transistor and other IC technologies as is known to those possessing an ordinary skill in the pertinent arts; however, this process of forming the circuit elements is not limited so.

In the following discussion, a Metal Oxide Semiconductor (MOS) transistor is used as an example of a Metal Insulator Semiconductor Field Effect Transistor (MISFET). In the drawings, a P-channel MOS transistor (PMOS transistor) shall be distinguished from an N-channel MOS transistor (NMOS transistor) by attaching a circular mark to its gate. Connection of a MOS transistor to a substrate potential is not explicitly shown in the drawings; the connection method in this regard is not definitive as long as the MOS transistor can operate normally.

FIG. 1 is a circuit diagram showing an example of a configuration of a semiconductor device according to an aspect of the present invention. The semiconductor device shown in FIG. 1 includes, for example, an input buffer Buf which is connected to a signal terminal IN through a signal node (signal wiring line) ND1, a PMOS transistor MP1, either one of whose source and drain being connected to a supply voltage node (high potential power supply wiring line) VDD (hereinafter, "VDD" may also be used to denote a supply voltage) and the other being connected to the signal node ND1, and a voltage generator circuit VG_p which supplies a reference voltage Vrefp (hereinafter, "Vrefp" may also be used to denote a reference voltage node) to the gate of the PMOS transistor MP1.

This semiconductor device circuitry represents the configuration of an input portion of a semiconductor chip and the input buffer Buf is further connected to an internal circuit provided with a predetermined function. The input terminal IN may be, for example, an external signal input terminal, an external signal input/output terminal, etc. To this terminal, a transmission line having a characteristic impedance, such as, for example, a microstrip line, is connected.

According to an aspect of the present invention, the PMOS transistor MP1 has both a function as an ESD protection circuit and a function as a termination circuit. That is, the PMOS transistor MP1 is a clamp element for ESD protection and has a function to clamp a voltage applied between the signal node ND1 and the supply voltage node VDD when a surge occurs at the signal terminal IN. Also, the PMOS transistor MP1 whose gate voltage is controlled to a predetermined voltage by the voltage generator circuit VG_p has the function as a terminating resistor having a predetermined resistance.

Figure 13:
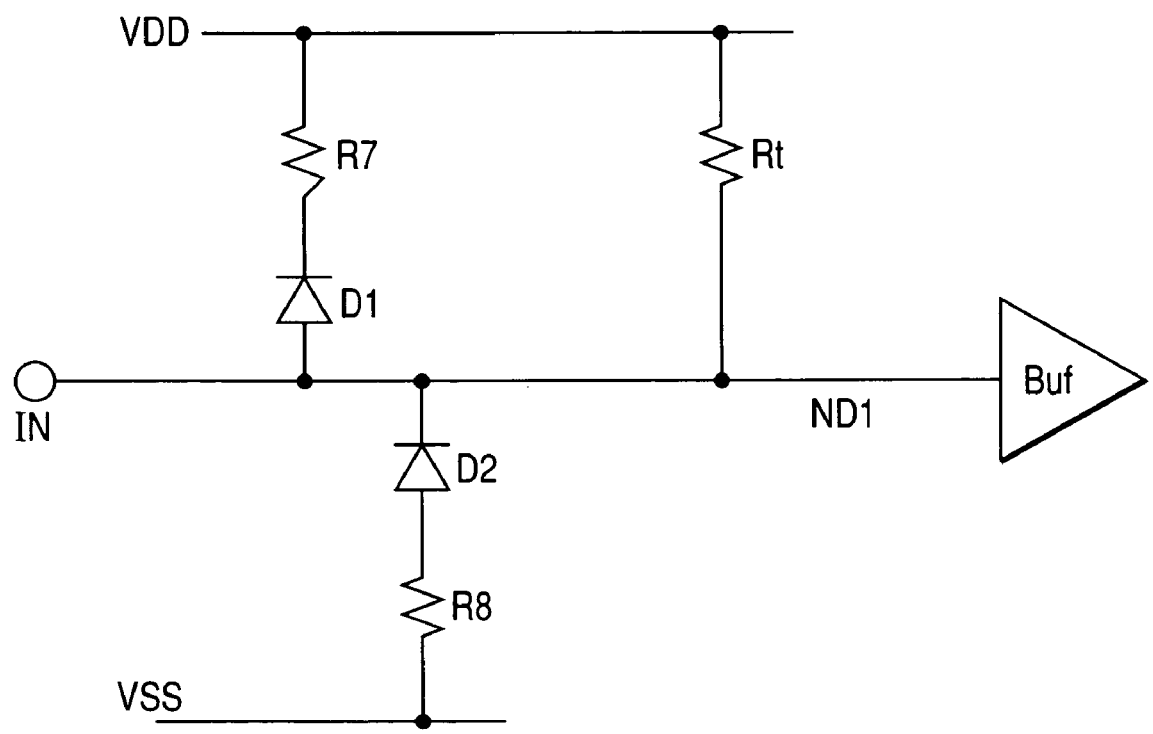
FIG. 13 is a circuit diagram showing an example of the configuration of an input circuit portion of a semiconductor device.

Thereby, it becomes unnecessary to provide both the ESD protection circuit and the termination circuit as separate circuits as in the circuitry described for FIG. 13 and, therefore, a decrease in the die area becomes possible. By configuring the voltage generator circuit VG_p to allow a plurality of reference voltages VrefP to be set, it becomes possible to adapt to transmission lines with different characteristic impedances such as, for example, 50Ω and 75Ω. By using the MOS transistor, additional capacitance of the signal node ND1 can be reduced and, therefore, can support high-speed operation.

In the configuration shown here, the PMOS transistor is placed between the signal node ND1 and the supply voltage node VDD and ESD protection and termination are provided on the side of the supply voltage node VDD. Instead, another configuration may be possible in which an NMOS transistor is placed between the signal node ND1 and a base voltage node (low potential power supply wiring line) VSS (hereinafter, "VSS" may also be used to denote a base voltage) and ESD protection and termination are provided on the side of the base voltage node VSS. Either of these configurations is a so-called parallel termination configuration.

Figure 2:
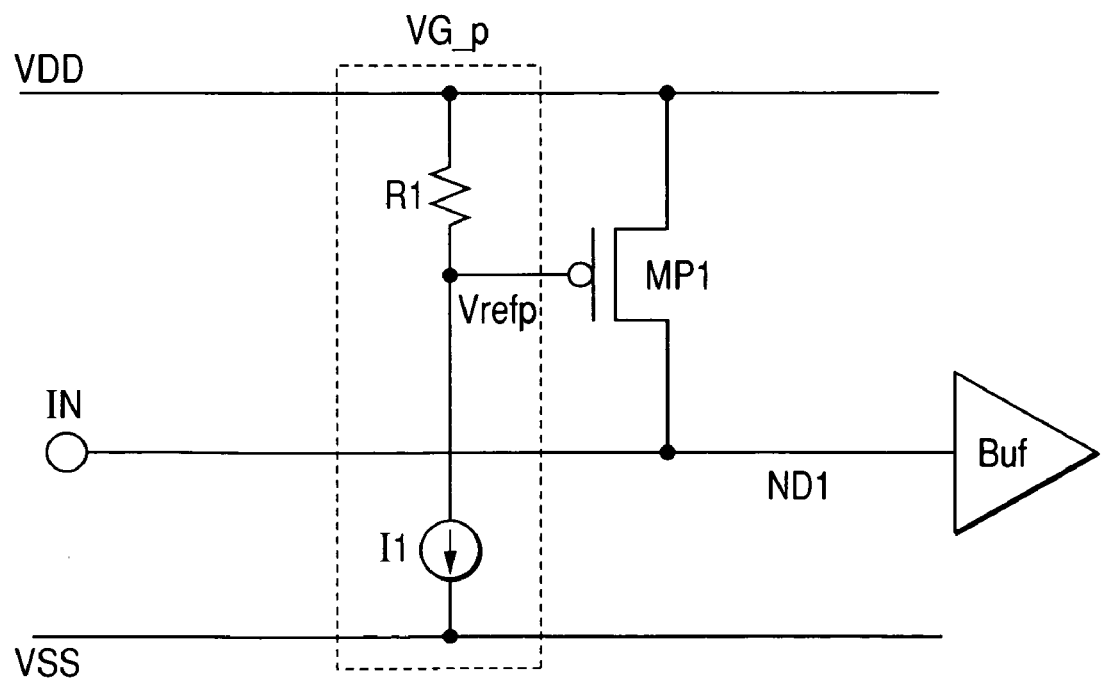
FIG. 2 is a circuit diagram showing an example of the configuration of the semiconductor device of FIG. 1, including a detail of a voltage generator circuit.

FIG. 2 is a circuit diagram showing an example of the configuration of the semiconductor device of FIG. 1, including a detail of the voltage generator circuit. In FIG. 2, the voltage generator circuit VG_p is formed by a resistor element (resistance) R1 and a current source (current) I1. That is, from the supply voltage node VDD toward the base voltage node VSS, the resistor element R1 and the current source I1 are connected in series and the reference voltage node Vrefp becomes a node connecting the resistor element R1 and the current source I1.

In the voltage generator circuit VG_p, a voltage across the resistor element R1 becomes a gate-source potential VGS of the PMOS transistor MP1. Thus, the gate-source potential VGS is adjusted by the resistance R1 and the current I1 so that the source-drain resistance of the PMOS transistor MP1 will be a predetermined value.

Figure 3:
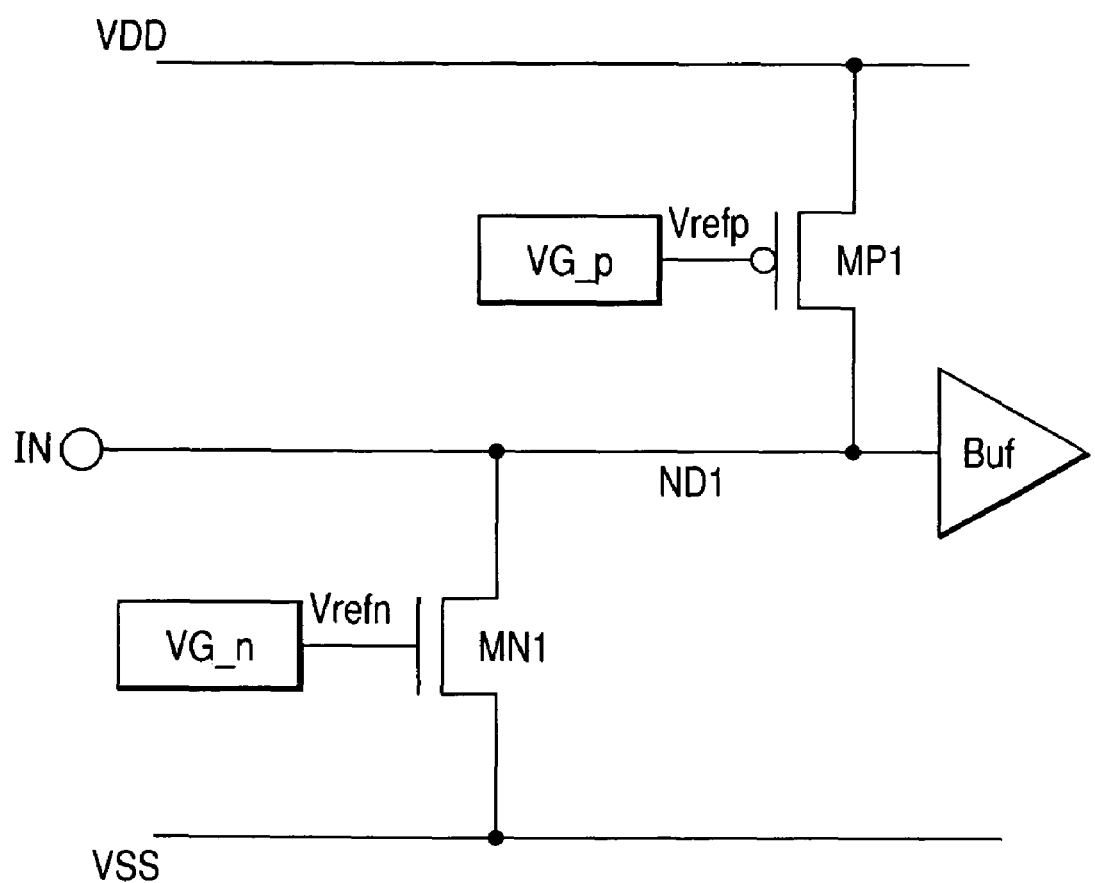
FIG. 3 is a circuit diagram showing an example of a configuration of a semiconductor device according to an aspect of the present invention.

FIG. 3 is a circuit diagram showing an example of a configuration of a semiconductor device according to an aspect of the present invention. The semiconductor device shown in FIG. 3 is configured, including an NMOS transistor MN1 placed between the signal node ND1 and the base voltage node VSS and a voltage generator circuit VG_n which supplies a reference voltage Vrefn to the gate of the NMOS transistor MN1 in addition to the configuration of FIG. 1.

The NMOS transistor MN1 is a clamp element for ESD protection, like the PMOS transistor MP1, and its gate voltage is controlled, with the result that it has the ESD protection function and the function as a terminating resistor. In terms of the ESD protection function, this configuration is provided with each clamp element on both the supply voltage node VDD side and the base voltage node VSS side of the signal node ND1. Even if either a positive or negative surge is applied to the signal node ND1, EST protection can be provided. On the other hand, in terms of the terminating resistor, this configuration can realize the function as so-called Thevenin termination.

Figure 4:
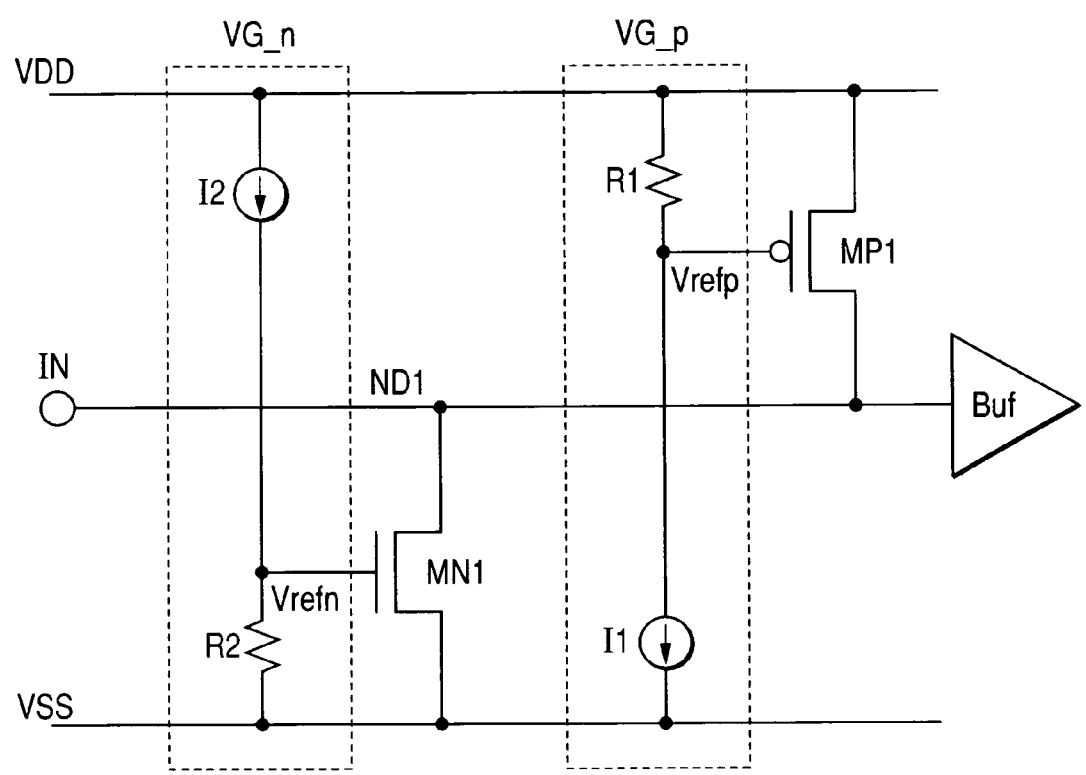
FIG. 4 is a circuit diagram showing an example of the configuration of the semiconductor device of FIG. 3, including details of voltage generator circuits.

FIG. 4 is a circuit diagram showing an example of the configuration of the semiconductor device of FIG. 3, including details of the voltage generator circuits. In FIG. 4, the configuration of the voltage generator circuit VG_p is the same as described for FIG. 2 and its explanation is not repeated. The voltage generator circuit VG_n is formed by a current source (current) I2 and a resistor element (resistance) R2. That is, from the supply voltage node VDD toward the base voltage node VSS, the current source I2 and the resistor element R2 are connected in series and the reference voltage node Vrefn becomes a node connecting the current source I2 and the resistor element R2.

In the voltage generator circuit VG_n, a voltage across the resistor element R2 becomes a gate-source potential VGS of the NMOS transistor MN1. Thus, the gate-source potential VGS is adjusted by the resistance R2 and the current I2 so that the source-drain resistance of the NMOS transistor MN1 will be a predetermined value.

Figure 5:
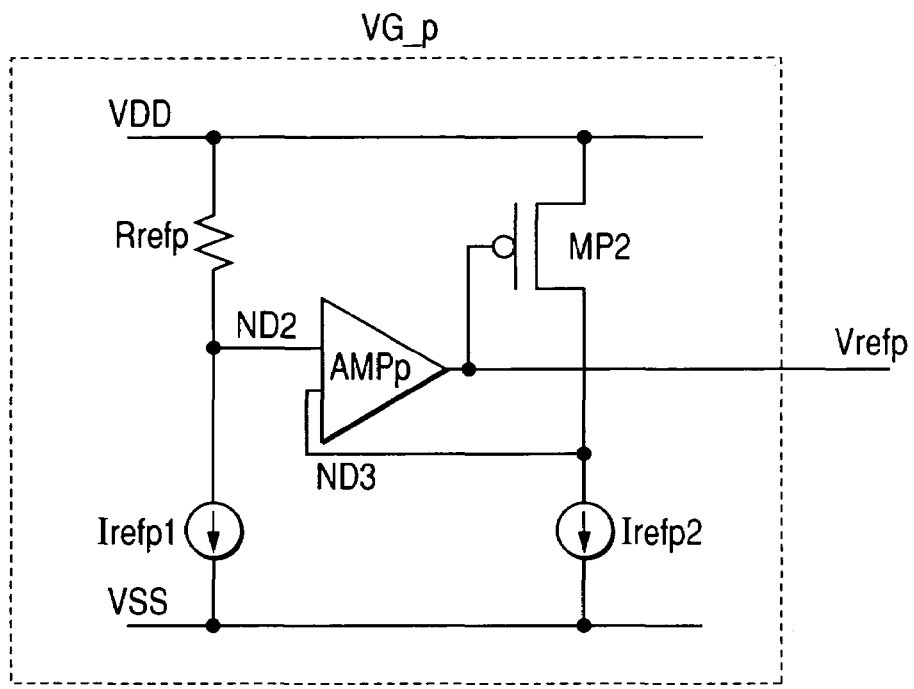
FIG. 5 is a circuit diagram showing an example of a configuration of one voltage generator circuit in the semiconductor device of FIG. 3.
Figure 6:
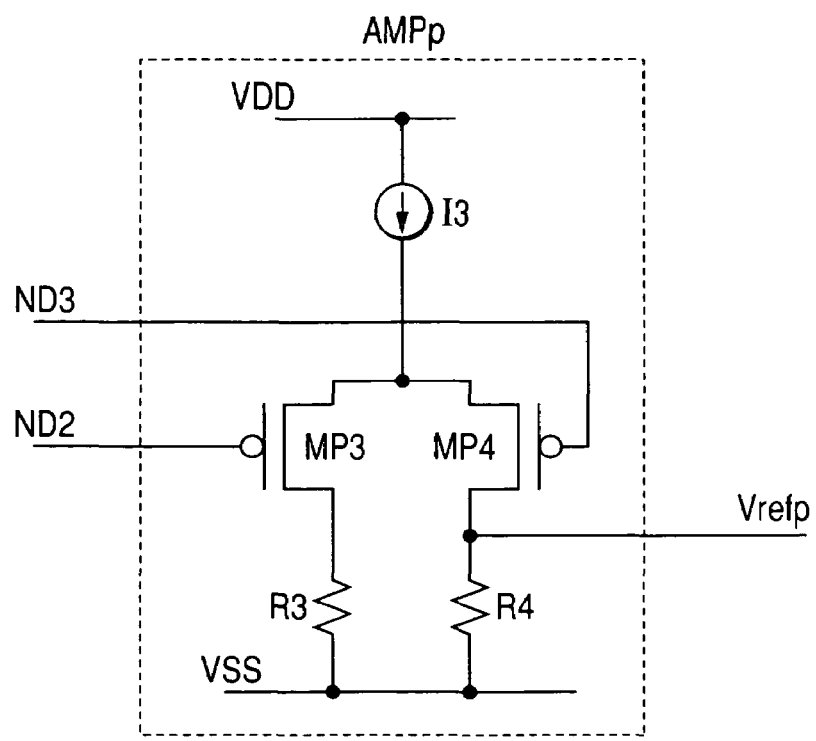
FIG. 6 is a circuit diagram showing an example of a configuration of an amplifier circuit in the voltage generator circuit of FIG. 5.

FIG. 5 is a circuit diagram showing an example of a configuration of a voltage generator circuit VG_p in the semiconductor device of FIG. 3. FIG. 6 is a circuit diagram showing an example of a configuration of an amplifier circuit AMPp in the voltage generator circuit VG_p of FIG. 5.

The voltage generator circuit VG_p shown in FIG. 5 is formed by a reference resistor element (reference resistance) Rrefp, reference current sources (reference currents) Irefp1 and Irefp2, an amplifier circuit AMPp, and a PMOS transistor MP2.

In FIG. 5, from the supply voltage node VDD toward the base voltage node VSS, the reference resistor element Rrefp and the reference current source Irefp1 are connected in series and a node ND2 connecting the reference resistor element Rrefp and the reference current source Irefp1 is connected to one input of the amplifier circuit AMPp. Also, from the supply voltage node VDD toward the base voltage node VSS, the PMOS transistor MP2 and the reference current source Irefp2 are connected in series and a node ND3 connecting the PMOS transistor MP2 and the reference current source Irefp2 is connected to the other input of the amplifier circuit AMPp.

Here, assuming that the gate width/gate length of the PMOS transistor MP1 in FIG. 3 are represented by Wp/Lp, the gate width/gate length of the PMOS transistor MP2 in FIG. 5 is designed to be (Wp/n)/Lp, where, for example, the gate width Wp is divided by n (n is an integer of 1 or greater). In this case, furthermore, the reference current Irefp2 is designed to be Irefp2=Irefp1/n, where the reference current Irefp1 is divided by n.

The amplifier circuit AMPP outputs a reference voltage Vrefp and supplies the reference voltage Vrefp to the gate of the PMOS transistor MP2. As shown in FIG. 6, the amplifier circuit AMPp is a generally used differential amplifier circuit and is formed by, for example, PMOS transistors MP3 and MP4, resistor elements (resistances) R3 and R4 and a current source (current) I3.

The sources of the PMOS transistors MP3 and MP4 are connected to a common connection and the current source I3 is placed between this common source connection and the supply voltage node VDD. A drain of the PMOS transistor MP3 is connected via a resistor element R3 to the base voltage node VSS and its gate becomes a connecting node ND2. A drain of the PMOS transistor MP4 is connected via resistor element R4 to the base voltage node VSS and its gate becomes a connecting node ND3. A reference voltage Vrefp is output from a node connecting the PMOS transistor MP4 and the resistor element R4 and this voltage is input to the gate of the PMOS transistor MP1 in FIG. 3.

This type of voltage generator circuit VG_p operates as follows. First, the voltage of the node ND3 becomes equal to the voltage of the node ND2 by a negative feedback principle of the amplifier circuit AMPp. This makes the voltage applied to the reference resistor element Rrefp equal to the voltage applied between the source and drain of the PMOS transistor MP2.

Here, the reference currents Irefp1 and Irefp2 are designed as noted above such that the current Irefp2 flowing between the source and drain of the PMOS transistor MP2 is 1/n of the current Irefp1 flowing through the reference resistor element Rrefp. Therefore, the source-drain resistance of the PMOS transistor MP2 becomes n times as much as Rrefp. To keep this resistance, the gate-source voltage (Vrefp-VDD) of the PMOS transistor MP2 is controlled by the output of the amplifier circuit AMPp.

On the other hand, the gate-source voltage of the PMOS transistor MP1 in FIG. 3 becomes equal to the above gate-source voltage of the PMOS transistor MP2. Here, according to the above design, the size of the PMOS transistor MP1 is n times as large as the size of the PMOS transistor MP2. Therefore, the PMOS transistor MP1 functions as a resistor having 1/n of the resistance of the PMOS transistor MP2. That is, the resistance of the PMOS transistor MP1 becomes equal to Rrefp.

In this operation, it is desired that the voltage of the node ND2 is set at an intermediate voltage between, for example, an "H" level signal and an "L" level signal that are input to the signal terminal IN. It is desirable that the PMOS transistor MP2 and the PMOS transistor MP1 are made to operate in an unsaturated region.

As above, by using the voltage generator circuit VG_p of FIG. 5, it becomes possible to fix the resistance of the PMOS transistor MP1 by the reference resistor element Rrefp. For example, if the PMOS transistor MP1 is required to function as a terminating resistor of 50Ω, the resistance of the reference resistor Rrefp should be set at 50Ω. Besides, the die area consumed by the voltage generator circuit VG_p can be reduced. Since the PMOS transistor MP1 in FIG. 3 is provided with the ESD protection function, its circuit area (gate width) is large and it is practically designed to have a so-called multi-finger structure in which multiple gates are arranged consecutively in one active region. On the other hand, because the size of the PMOS transistor MP2 can be reduced to 1/n of the size of the PMOS transistor MP1, the PMOS transistor MP2 is a transistor occupying a small area.

Figure 7:
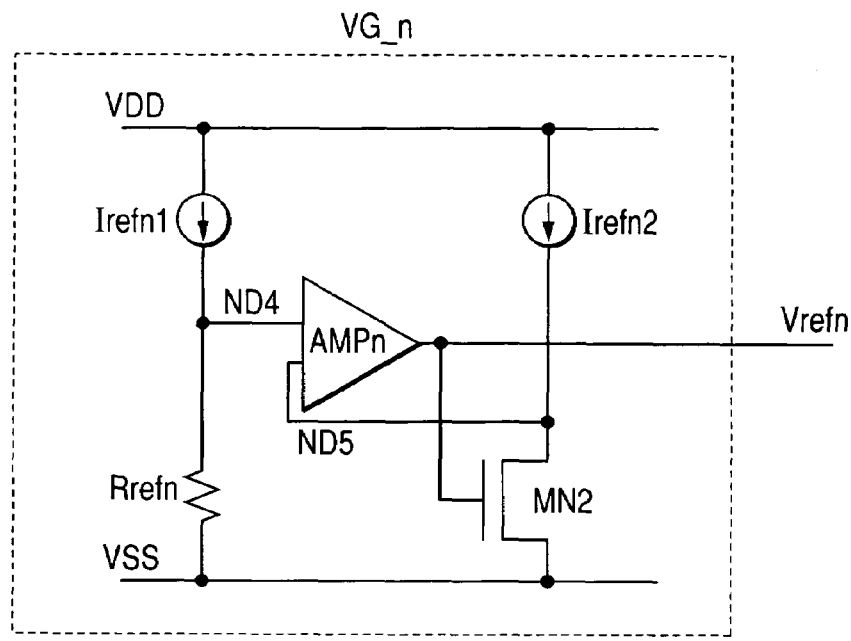
FIG. 7 is a circuit diagram showing an example of a configuration of the other voltage generator circuit in the semiconductor device of FIG. 3.
Figure 8:
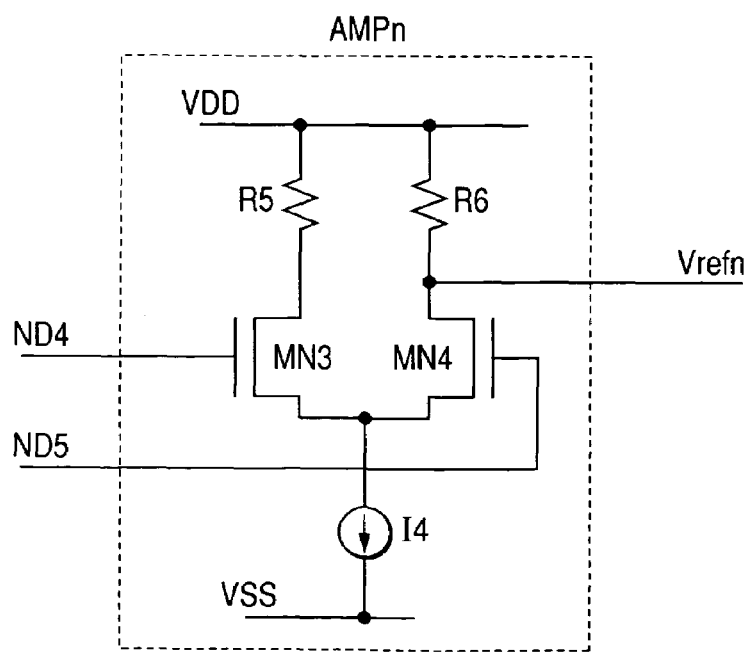
FIG. 8 is a circuit diagram showing an example of a configuration of an amplifier circuit in the voltage generator circuit of FIG. 7.

FIG. 7 is a circuit diagram showing an example of a configuration of a voltage generator circuit VG_n in the semiconductor device of FIG. 3. FIG. 8 is a circuit diagram showing an example of a configuration of an amplifier circuit AMPn in the voltage generator circuit VG_n of FIG. 7.

Similarly to the voltage generator circuit VG_p of FIG. 5, the voltage generator circuit VG_n shown in FIG. 7 is formed by a reference resistor element (reference resistance) Rrefn, reference current sources (reference currents) Irefn1 and Irefn2, an amplifier circuit AMPn, and an NMOS transistor MN2. However, because the voltage generator circuit VG_n is used to set the gate-source voltage (Vrefn-VSS) of the NMOS transistor MN1 in FIG. 3, the arrangement of the elements being connected differs from that of the above voltage generator circuit VG_p of FIG. 5 to set the gate-source voltage (Vrefp-VDD) of the PMOS transistor MP1.

In the voltage generator circuit VG_n, from the supply voltage node VDD toward the base voltage node VSS, the reference current source Irefn1 and the reference resistor element Rrefn are connected in series and a node ND4 connecting the reference current source Irefn1 and the reference resistor element Rrefn is connected to one input of the amplifier circuit AMPn. Also, from the supply voltage node VDD toward the base voltage node VSS, the reference current source Irefn2 and the NMOS transistor MN2 are connected in series and a node ND5 connecting the reference current source Irefn2 and the NMOS transistor MN2 is connected to the other input of the amplifier circuit AMPn.

The amplifier circuit AMPn outputs a reference voltage Vrefn and supplies the reference voltage Vrefn to the gate of the NMOS transistor MN2. As shown in FIG. 8, the amplifier circuit AMPn is a generally used differential amplifier circuit and is formed by, for example, NMOS transistors MN3 and MN4, resistor elements (resistances) R5 and R6 and a current source (current) I4.

The sources of the NMOS transistors MN3 and MN4 are connected to a common connection and the current source I4 is placed between this common source connection and the base voltage node VSS. A drain of the NMOS transistor MN3 is connected via a resistor element R5 to the supply voltage node VDD and its gate becomes a connecting node ND4. A drain of the NMOS transistor MN4 is connected via resistor element R6 to the supply voltage node VDD and its gate becomes a connecting node ND5. A reference voltage Vrefn is output from a node connecting the NMOS transistor MN4 and the resistor element R6 and this voltage is input to the gate of the NMOS transistor MN1 in FIG. 3.

By using this type of voltage generator circuit VG_n and designing the sizes of the transistors and the currents in the same manner as for the above voltage generator circuit VG_p, it becomes possible to fix the resistance of the NMOS transistor MN1 by the resistor element Rrefn. Using the voltage generator circuits VG_p and VG_n, by fixing the resistance on the supply voltage node VDD side and the resistance on the base voltage node VSS side respectively in FIG. 3, optimal signal termination for the characteristics of a transmission line, for example, can be provided. Besides, the voltage generator circuit VG_n can be formed in a small area similarly to the voltage generator circuit VG_p.

While some configuration examples of the voltage generator circuits VG_p and VG_n are shown in FIGS. 4 through 8, the voltage generator circuits VG_p and VG_n are not limited to these configuration examples and those capable of generating a constant voltage can be employed without a problem. The voltage generator circuits VG_p and VG_n can be realized by, for example, a band-gap reference circuit, a regulator circuit, and other circuits producing a similar constant voltage which are widely known.

Figure 9:
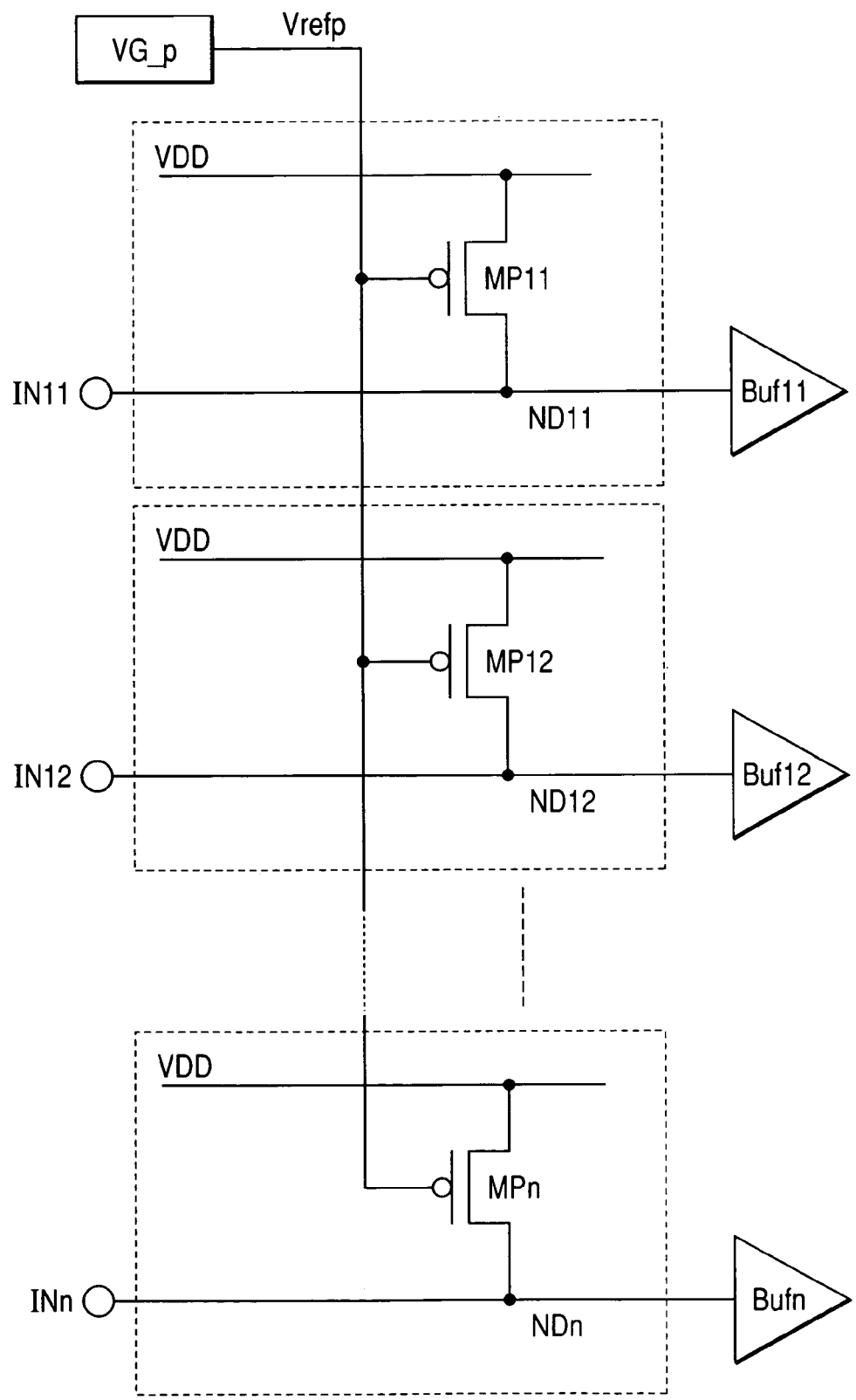
FIG. 9 is a circuit diagram showing an example of a configuration of a semiconductor device according to an aspect of the present invention.

FIG. 9 is a circuit diagram showing an example of a configuration of a semiconductor device according to an aspect of the present invention. In this configuration, the semiconductor device shown in FIG. 9 is equipped with a plurality of signal terminals IN11, IN12, through INn. PMOS transistors MP11, MP12, through MPn, each having the above-described ESD protection function and termination function, provided respectively for the signal terminals. Voltage to drive the gates of these PMOS transistors is supplied from a common voltage generator circuit VG_p.

The plurality of signal terminals IN11, IN12, through Inn are respectively connected to input buffers Buf11, Buf 12, through Bufn via signal nodes ND11, ND12, through NDn. The PMOS transistors MP11, MP12, through MPn are respectively placed between each of the signal nodes ND11, ND12, through NDn and each supply voltage node VDD.

Particularly, in an instance where a semiconductor chip has a larger number of signal terminals, the effect of decreasing the die area by applying the present invention becomes more significant, because there is no need for providing terminating resistor elements for each signal terminal, which would have to be provided otherwise as in the circuitry described for FIG. 13. Besides, because a single common voltage generator circuit VG_p is provided to supply a voltage to the plurality of signal terminals, the die area consumed by this circuit does not increase even if the number of signal terminals increases. While the configuration in which parallel termination to the supply voltage node VDD side is provided for each signal terminal is shown here, of course, other configurations for parallel termination to the base voltage node VSS side and Thevenin termination as shown in FIG. 3 may be possible.

Figure 10:
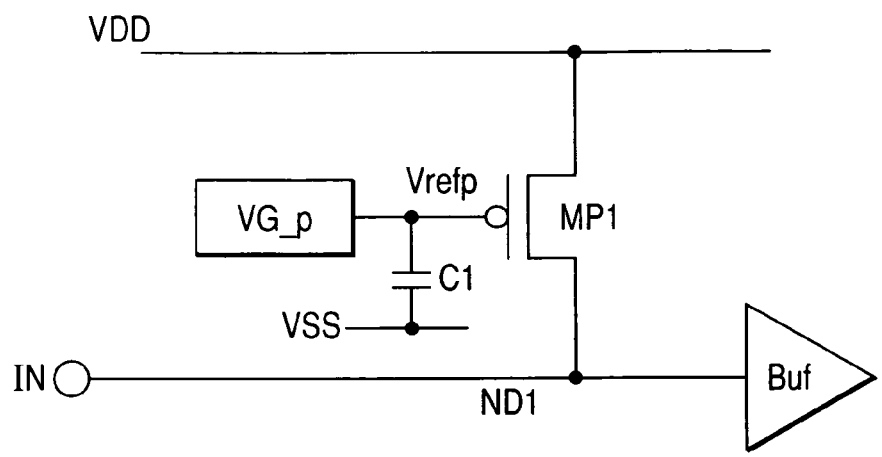
FIG. 10 is a circuit diagram showing an example of a configuration of a semiconductor device according to an aspect of the present invention.

FIG. 10 is a circuit diagram showing an example of a configuration of a semiconductor device according to an aspect of the present invention. In this configuration, the semiconductor device shown in FIG. 10 is equipped with a capacitor C1 between the reference voltage node Vrefp at which a voltage is output from the voltage generator circuit VG_p in the configuration example of FIG. 1 and the base voltage node vss.

In the case in which the output of a single voltage generator circuit VG_p is supplied through a common wiring line to the gates of a plurality of transistors respectively provided for a plurality of signal terminals, for example, like the above configuration shown in FIG. 9, the length of the wiring line is anticipated to be long. In this case, a signal transmitted on this wiring line may be affected by noise produced by coupling from circuits near to the line causing the gate voltage of each transistor to become unstable. By provision of a so-called bypass capacitor C1 on this wiring line (reference voltage node Vrefp), the reference voltage Vrefp can be stabilized.

Figure 11:
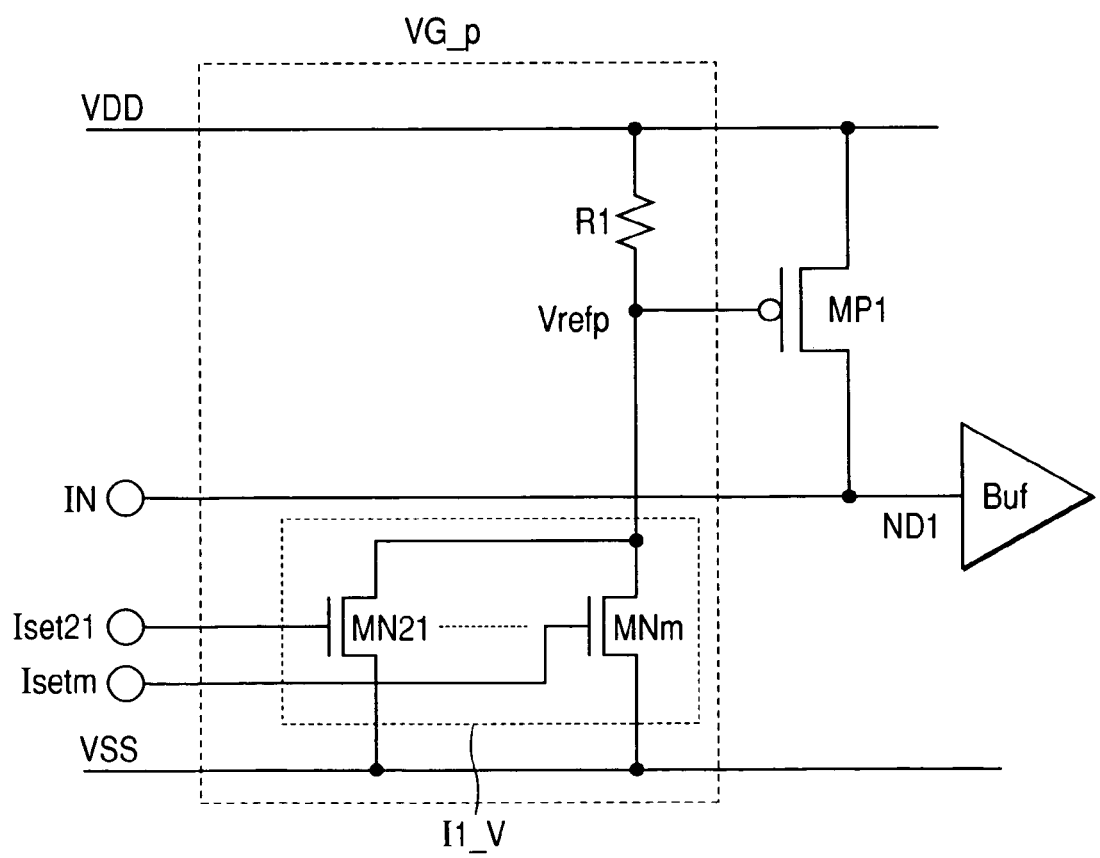
FIG. 11 is a circuit diagram showing an example of a modified configuration of the voltage generator circuit in FIG. 2.

FIG. 11 is a circuit diagram showing an example of a modified configuration of the voltage generator circuit VG_p in FIG. 2. The voltage generator circuit VG_p shown in FIG. 11 is an example of its configuration in which a variable current source I1_V superseded the current source I1 in FIG. 2. In the voltage generator circuit VG_p shown in FIG. 11, a resistor element R1 is placed between the supply voltage node VDD and the reference voltage node Vrefp and a plurality of NMOS transistors MN21 through MNm connected in parallel are placed between the reference voltage node Vref and the base voltage node VSS. The voltages of the gates of the NMOS transistors MN21 through MNm can be controlled by current setting terminals Iset 21 through Isetm, respectively. Here, it is assumed that all the NMOS transistors MN21 through MNm are of the same size.

In this configuration, for example, the current setting terminals Iset 21 through Isetm are respectively set to a high level voltage or a low level voltage. Among the NMOS transistors MN21 through MNm, only NMOS transistors in which the high level voltage is applied to the gate are turned ON. Then, a current corresponding to the gate voltage (high level voltage) flows through the NMOS transistors turned ON. By controlling a value of high level voltage and the number of NMOS transistors to be turned on, current output from the current source can be adjusted variably. Thereby, it is possible to control a current flowing through the resistor element R1, set the reference voltage Vrefp arbitrarily, and set the resistance of the PMOS transistor MP1 freely.

By using a configuration like this, it is possible to easily adapt to a plurality of transmission lines with different characteristic impedances. In a case where the reference voltage Vrefp does not match its desired value due to manufacturing variance or other reasons, this configuration may be used as a means for trimming the reference voltage. The current setting terminals may be either external setting terminals or internal setting terminals on the chip.

Figure 12:
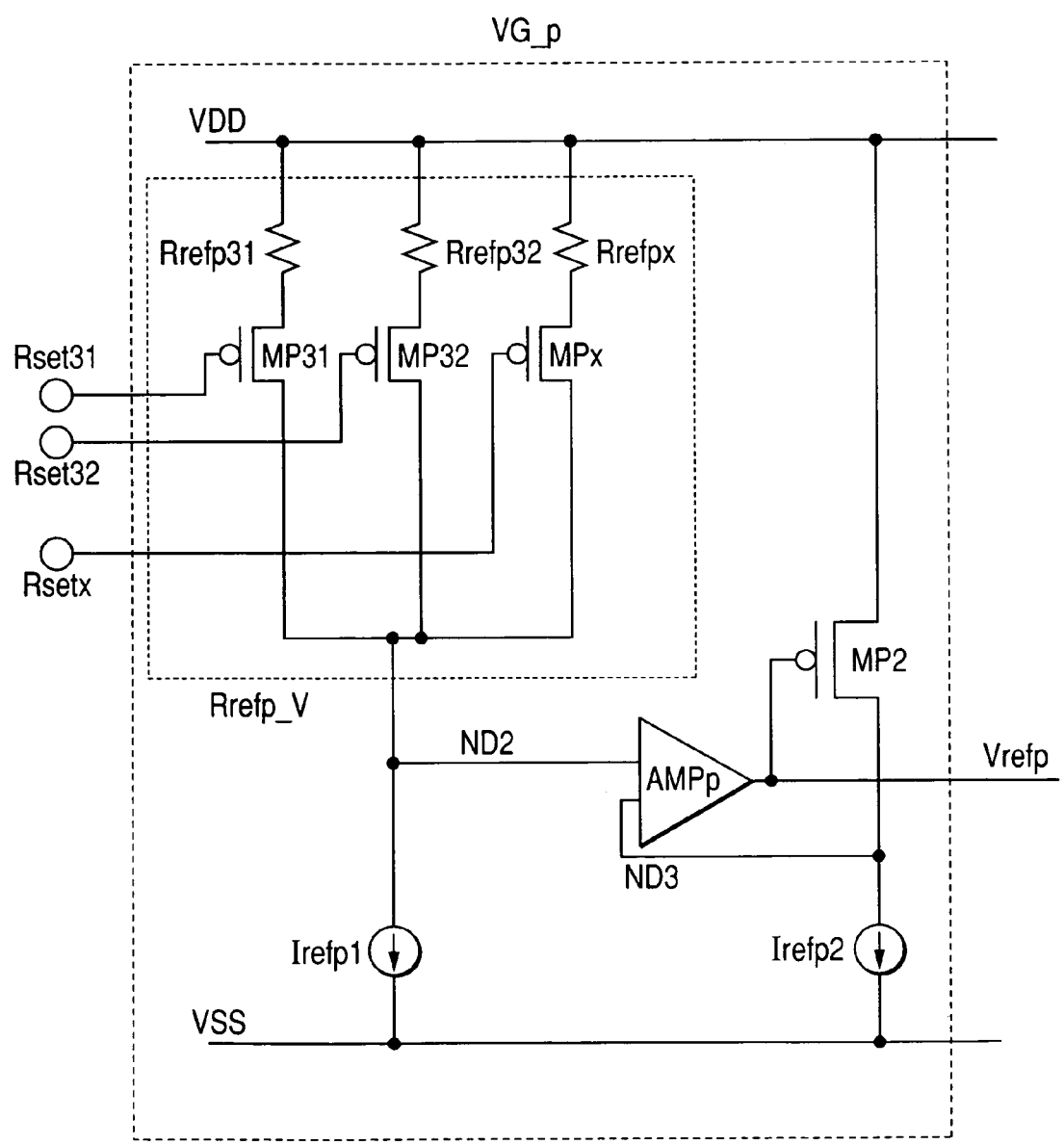
FIG. 12 is a circuit diagram showing an example of a modified configuration of the voltage generator circuit of FIG. 5.

FIG. 12 is a circuit diagram showing an example of a modified configuration of the voltage generator circuit VG_p of FIG. 5. The voltage generator circuit VG_p shown in FIG. 12 is an example of its configuration in which a variable resistor circuit Rrefp_V superseded the reference resistor element Rrefp in FIG. 5. Other components are the same as those in FIG. 5 and, therefore, their explanation is not repeated.

In the variable resistor circuit Rrefp_V, reference resistor elements Rrefp31, Rrefp32, through Rrefpx and a corresponding number of switches are connected in series, respectively. These series-connected reference resistor elements and switches are connected in parallel between the supply voltage node VDD and one input node ND2 of the above amplifier circuit AMPp. In this example, PMOS transistors are employed as the switches and PMOS transistors MP31, MP32, through PMx corresponding to the reference resistor elements Rrefp31, Rrefp32, through Rrefpx are used. The ON/OFF of the PMOS transistors MP31, MP32, through PMx can be controlled by resistance setting terminals Rset31, Rset32, through Rsetx, each being connected to the gate of each transistor.

As described above, the resistance of the PMOS transistor MP1 can be fixed by the resistance of the reference resistor element. Therefore, by arbitrarily selecting from among the reference resistor elements Rrefp31, Rrefp32, through Rrefpx by the resistance setting terminals, the resistance (terminating resistance) of the PMOS transistor MP2 can be set freely. Thereby, similarly to the foregoing, it becomes possible to easily adapt to a plurality of transmission lines with different characteristic impedances and reference voltage variation due to manufacturing variance and other reasons. The resistance setting terminals may be either external setting terminals or internal setting terminals on the chip. The variable current source implementation method described for FIG. 11 and the variable resistor implementation method described for FIG. 12 are not restrictive and can be changed or varied by using techniques known to those possessing an ordinary skill in the pertinent arts.

The semiconductor device of the present invention is a technique that is especially useful for application to LSIs for use in communications devices, wherein high-speed and smaller LSIs are required. Moreover, this technique is widely applicable to various kinds of LSIs as the technique for realizing ESD protection and signal termination with a small die area.

Those of ordinary skill in the art may recognize that many modifications and variations of the present invention may be implemented without departing from the spirit or scope of the invention. Thus, it is intended that the present invention covers the modifications and variations of this invention provided they come within the scope of the appended claims and their equivalents.

What is claimed is:

1. A semiconductor device comprising:
a signal terminal:
a signal wiring line connected to said signal terminal:
a power supply wiring line;
an input buffer connected to said signal wiring line;
a first transistor which clamps a voltage between said signal wiring line and said power supply wiring line by source-drain conduction to provide electrostatic discharge (ESD) protection; and
a voltage generator circuit which controls a gate voltage of said first transistor,
wherein a source-drain resistance of said first transistor is set by said voltage generator circuit, whereby said first transistor is provided with a function of signal termination.

2. The semiconductor device according to claim 1,
wherein said power supply wiring line comprises a high potential power supply wiring line and a low potential power supply wiring line, and
wherein said first transistor is a P-channel MOS transistor placed between said signal wiring line and said high potential power supply wiring line.

3. The semiconductor device according to claim 1,
wherein said power supply wiring line comprises a high potential power supply wiring line and a low potential power supply wiring line, and
wherein said first transistor is an N-channel MOS transistor placed between said signal wiring line and said low potential power supply wiring line.

4. The semiconductor device according to claim 1,
wherein said voltage generator circuit comprises a resistor element connected between a gate of said first transistor and said power supply wiring line and a current source for setting a current to flow through said resistor element.

5. The semiconductor device according to claim 1,
wherein said voltage generator circuit comprises:
an amplifier circuit having a first input node, a second input node, and an output node;
a reference resistor connected between said power supply wiring line and said first input node;
a first current source for setting a current to flow through said reference resistor;
a referential transistor, with a source and a drain being connected between said power supply wiring line and said second input node and a gate being connected to said output node; and
a second current source for setting a current flow through said referential transistor,
wherein said output node is connected to the gate of said first transistor,
wherein the size of said referential transistor is $1/n$ ($n \geq 1$) of the size of said first transistor, and
wherein the value of current from said second current source is $1/n$ of the value of current from said first current source.

6. The semiconductor device according to claim 4,
wherein said current source is a variable current source.

7. The semiconductor device according to claim 5,
wherein said reference resistor is a variable resistor.

8. The semiconductor device according to claim 6,
wherein said variable current source comprises a plurality of transistors connected in parallel between source and drain and the current is set by controlling the gate voltage of each of said plurality of transistors.

9. A semiconductor device comprising:
a plurality of signal terminals;
a plurality of signal wiring lines respectively connected to said plurality of signal terminals;
a power supply wiring line;
a plurality of input buffers respectively connected to said plurality of signal wiring lines;
a plurality of first transistors, each of which clamps a voltage between each of said plurality of signal wiring lines and said power supply wiring line by source-drain conduction to provide ESD protection; and
a voltage generator circuit commonly controlling the gate voltage of each of said plurality of first transistors,
wherein a source-drain resistance of each of said plurality of first transistors is set by said voltage generator circuit, whereby said plurality of first transistors are provided with a function of signal termination.

10. The semiconductor device according to claim 9,
wherein said voltage generator circuit comprises:
an amplifier circuit having a first input node, a second input node, and an output node;
a reference resistor connected between said power supply wiring line and said first input node;
a first current source for setting a current to flow through said reference resistor;
a referential transistor, with a source and a drain being connected between said power supply wiring line and said second input node and a gate being connected to said output node; and
a second current source for setting a current flow through said referential transistor,
wherein said output node is connected in common to the gates of said plurality of first transistors,
wherein the size of said referential transistor is $1/n$ ($n \geq 1$) of the size of each of said plurality of first transistors, and
wherein the value of current from said second current source is $1/n$ of the value of current from said first current source.

11. The semiconductor device according to claim 9, further comprising a plurality of capacitors, each of which is placed between each of the gates of said plurality of first transistors and said power supply wiring line.

12. The semiconductor device according to claim 10,
wherein said reference resistor is a variable resistor comprising a plurality of switches and resistor elements, each of said plurality of switches and each of said plurality of resistor elements connected in series, wherein each of the series-connected switches and resistor elements are connected in parallel, and a resistance is set by controlling each of said switches.

13. A semiconductor device comprising:
a signal terminal;

a signal wiring line connected to said signal terminal;
a high potential power supply wiring line;
a low potential power supply wiring line;
an input buffer connected to said signal wiring line;
a first transistor which clamps a voltage between said signal wiring line and said high potential power supply wiring line by source-drain conduction to provide ESD protection;
a second transistor which clamps a voltage between said signal wiring line and said low potential power supply wiring line by source-drain conduction to provide ESD protection;
a first voltage generator circuit which controls a gate voltage of said first transistor; and
a second voltage generator circuit which controls a gate voltage of said second transistor,
wherein a source-drain resistance of said first transistor is set by said first voltage generator circuit and a source-drain resistance of said second transistors is set, by said second voltage generator circuit, whereby said first and second transistors are provided with a function of signal termination.

14. The semiconductor device according to claim 13,
wherein said first transistor is a P-channel MOS transistor and said second transistor is an N-channel MOS transistor.

15. The semiconductor device according to claim 14,
wherein said first voltage generator circuit comprises:
a first amplifier circuit having a first input node, a second input node, and a first output node;
a reference resistor connected between said high potential power supply wiring line and said first input node;
a first current source connected between said first input node and said low potential power supply wiring line;
a first referential transistor, which is a P-channel MOS transistor, having a source and a drain connected between said high potential power supply wiring line and said second input node and a gate connected to said first output node; and
a second current source connected between said second input node and said low potential power supply wiring line,
wherein said first output node is connected to the gate of said first transistor,
wherein the size of said first referential transistor is 1/n (n≧1) of the size of said first transistor, and
wherein the value of current from said second current source is 1/n of the value of current from said first current source.

16. The semiconductor device according to claim 14,
wherein said second voltage generator circuit comprises:
a second amplifier circuit having a third input node, a fourth input node, and a second output node;
a reference resistor connected between said third input node and said low potential power supply wiring line;
a third current source connected between said low potential power supply wiring line and said third input node;
a second referential transistor, which is an N-channel MOS transistor, having a source and a drain connected between said fourth input node and said low potential power supply wiring line and a gate connected to said second output node; and
a fourth current source connected between said high potential power supply wiring line and said fourth input node,
wherein said second output node is connected to the gate of said second transistor,
wherein the size of said second referential transistor is 1/n (n≧1) of the size of said second transistor, and
wherein the value of current from said fourth current source is 1/n of the value of current from said third current source.

* * * * *